United States Patent
Derra et al.

(10) Patent No.: US 8,097,092 B2
(45) Date of Patent: Jan. 17, 2012

(54) METHOD OF CLEANING AND AFTER TREATMENT OF OPTICAL SURFACES IN AN IRRADIATION UNIT

(75) Inventors: Guenther Hans Derra, Aachen (DE); Thomas Kruecken, Aachen (DE); Christof Metzmacher, Aachen (DE); Achim Weber, Aachen (DE); Peter Zink, Aachen (DE)

(73) Assignee: Kninklijke Philips Electronics N.V., Eindhoven (NL)

( * ) Notice: Subject to any disclaimer, the term of this patent is extended or adjusted under 35 U.S.C. 154(b) by 687 days.

(21) Appl. No.: 11/993,040

(22) PCT Filed: Jun. 20, 2006

(86) PCT No.: PCT/IB2006/051984
§ 371 (c)(1),
(2), (4) Date: Dec. 19, 2007

(87) PCT Pub. No.: WO2006/137014
PCT Pub. Date: Dec. 28, 2006

(65) Prior Publication Data
US 2010/0051064 A1    Mar. 4, 2010

(30) Foreign Application Priority Data
Jun. 21, 2005 (EP) .................................... 05105476

(51) Int. Cl.
*B08B 5/00* (2006.01)
*G03F 7/20* (2006.01)

(52) U.S. Cl. ............. 134/30; 134/2; 134/21; 250/492.2; 250/504 R

(58) Field of Classification Search ........................ None
See application file for complete search history.

(56) References Cited

U.S. PATENT DOCUMENTS

| 6,724,460 B2 | 4/2004 | Van Schaik et al. |
| 6,772,776 B2 | 8/2004 | Klebanoff et al. |
| 6,781,685 B2 | 8/2004 | Hamm |
| 2004/0007246 A1 | 1/2004 | Chan et al. |
| 2004/0011381 A1 | 1/2004 | Klebanoff et al. |
| 2006/0175558 A1* | 8/2006 | Bakker et al. .............. 250/492.2 |

FOREIGN PATENT DOCUMENTS

| EP | 1536035 A2 | 6/2005 |
| WO | 2004104707 A2 | 12/2004 |
| WO | 2006011105 A2 | 2/2006 |

* cited by examiner

Primary Examiner — Necholus Ogden, Jr.

(57) ABSTRACT

The present invention relates to a method of cleaning and after treatment of optical surfaces in an irradiation unit, said irradiation unit comprising a radiation source (1, 31) emitting EUV-radiation and/or soft X-rays, a first volume (40) following said radiation source (1, 31) and containing first optical components (3, 33) with said optical surfaces, and a second volume (41) following said first volume (40) and containing second optical components (38). The method comprises at least one cleaning step in which a first gas or gas mixture is brought into contact with said optical surfaces, thereby forming volatile compounds with contaminations deposited on said optical surfaces, wherein said compounds are pumped out of the first volume (40) together with the first gas or gas mixture. In an after treatment step following said cleaning step the radiation source (1, 3) is operated once or several times in order to release residues of the cleaning step from the optical surfaces by irradiating said optical surfaces with said EUV-radiation or soft X-rays while the first volume (40) is separated from the second volume (41), wherein said released residues are pumped out of the first volume (40). With this method an improved cleaning result is achieved.

12 Claims, 3 Drawing Sheets

Figure 1:
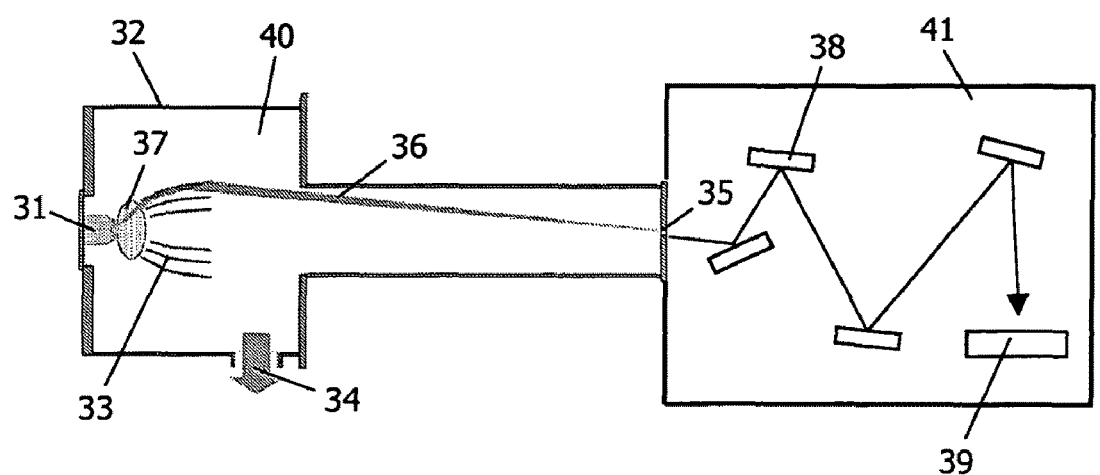

METHOD OF CLEANING AND AFTER TREATMENT OF OPTICAL SURFACES IN AN IRRADIATION UNIT

The present invention relates to a method of cleaning and after treatment of optical surfaces in an irradiation unit, said irradiation unit comprising a radiation source emitting EUV-radiation and/or soft X-rays, a first volume following said radiation source and containing first optical components with said optical surfaces, and a second volume following said first volume and containing second optical components. Said method comprises a cleaning step in which a first gas or gas mixture is brought into contact with said optical surfaces, thereby forming volatile compounds with contaminations deposited on said optical surfaces, wherein said compounds are pumped out of the first volume together with the first gas or gas mixture.

In the field of optical lithography for semiconductor industry complex optics are used in order to ensure the required imaging quality. This applies in particular to EUV-lithography, i.e. lithography with extreme ultraviolet (EUV) radiation, in which grazing incidence mirrors and multilayer mirrors are arranged in a vacuum chamber between the radiation source and the wafer substrate to be irradiated. For both types of mirrors an extremely high surface quality with a micro roughness of approximately 1 nm or more is required. Optical lenses are not usable due to the high absorbance of the materials in this wavelength region. For the same reason it is not possible to arrange windows between the radiation source and the optical components, so that the radiation source, the optical components, the lithographic mask and the substrate form a continuous vacuum system without completely separating elements in between.

In this continuous vacuum system, however, gases and particles from the radiation source can move to the optical components. The resulting contaminations on the surfaces of these optical components reduce the optical quality of the whole optical system.

Radiation sources used for EUV-lithography today are gas discharge plasmas or laser plasmas. In both cases a very hot plasma is generated, in which multiple ionized ions emit radiation in the short wavelength EUV-region. In gas discharge plasmas the plasma is generated and heated by the electrical energy of the discharge. In laser plasmas a laser beam of high power is focused on a gaseous, liquid or solid target for generation of the hot plasma.

Substances emitting radiation in the EUV-region, in particular at a wavelength of 13.5 nm which is favorable for the use with multilayer mirrors, are xenon, lithium, tin, indium, antimony and tellurium. While xenon as a noble gas is highly volatile, most of the metallic substances are low volatile substances. These substances can move from the radiation source to the optical components and condense on the optical surfaces. Non-volatile substances can also be released by erosion of the electrodes during the discharge or through the nozzles necessary to form the targets for generating the laser plasma. Material released from the radiation source and moving in the direction of the optical components is called debris.

Debris layers can deposit on the optical components reducing the quality of these components. Already very thin deposited layers of only 1 nm significantly reduce the reflected intensity of the EUV-radiation due to absorption losses on the mirrors. In addition to the degradation during operation time caused by the growing layers also a spatial inhomogeneity arises, since the material deposition on the mirrors is not constant over the mirror surface.

The optical surfaces of optical components of such an irradiation unit, in particular the optical surfaces of the collector mirror of an EUV irradiation unit, have to be cleaned repeatedly in order to remove the contaminations deposited on the optical surfaces. FIG. 1 schematically shows a typical layout of an EUV-lithography system. The EUV irradiation unit basically consists of the radiation source 31, a collector 33 and multilayer mirrors 38 in a vacuum vessel 32. The radiation emitted from the radiation source 31 is collected by the reflective collector 33 and focused on an intermediate focus 35. At the position of this intermediate focus 35 an aperture connects this first volume 40 with a second volume 41 of the irradiation unit. In this second volume 41 the multilayer mirrors 38 are arranged to guide the radiation from the intermediate focus 35 to the mask and the wafer substrate 39. In most EUV-lithography systems means 37 for debris mitigation are arranged between the radiation source 31 and the collector 33. In order to achieve economical operation of the lithography system the debris should be reduced by at least seven orders of magnitude. Such a high mitigation however, is very difficult on the short distance between the radiation source and the collector and up to now could not be experimentally demonstrated. Therefore, there is a great need for suitable cleaning methods in order to prolongate the lifetime of the collector.

WO2004/104707 A2 describes a method and a device for cleaning at least one optical component of an irradiation unit, in particular for EUV-radiation or soft X-rays. In the described method at least one gas is brought into contact with the optical surfaces in a cleaning step thereby forming volatile compounds with a portion of the contaminations deposited on said optical surfaces. This cleaning step can be performed online during the operation of the irradiation unit or offline in an operation pause of the irradiation unit. As suitable gases for this cleaning step the document proposes hydrogen containing substances, halogens, inter-halogen compounds and halogen containing compounds. By additionally irradiating these gases with UV or EUV-radiation radicals are generated which enhance the reaction rates with the contaminations. The prior art document also discloses the delivery of additional gases in order to passivate components within the vacuum vessel so that they get protected against the cleaning gas.

It is an object of the present invention to further improve such a method of cleaning optical surfaces in an irradiation unit in order to improve the cleaning result and/or to better conserve the optical surfaces.

This object is achieved with the method of present claims 1 and 5. Advantageous embodiments of the method are subject of the dependent claims and are furthermore described in the following description and examples for carrying out the invention.

The present method relates to the cleaning of an irradiation unit comprising a radiation source emitting EUV-radiation and/or soft X-rays, a first volume following said radiation source and containing first optical components with said optical surfaces, and a second volume following said first volume and containing second optical components. In such an irradiation unit the first optical components and the second optical components form a optical radiation path for the illumination of an object, for example in EUV lithography a mask and a wafer. The present method includes a cleaning step in which a first gas or gas mixture, in the following also called cleaning gas, is brought into contact with said optical surfaces, thereby forming volatile compounds, preferably highly volatile compounds, with contaminations deposited on said optical surfaces. Said compounds are pumped out of the first volume together with the first gas or gas mixture during or at the end of the cleaning step. The method is characterized by an after treatment step following said cleaning step. In this after treatment step according to claim 1 the radiation source of the irradiation unit is operated once or several times in order to release residues of the cleaning step from the optical surfaces by irradiating said optical surfaces with said EUV-radiation or soft X-rays. The released or desorbed residues are pumped out of the first volume during or at the end of this after treatment step. During the after treatment step the first volume is separated from the second volume, preferably in a gastight manner. The first volume, however, is not separated from the radiation source in this after treatment step in order to enable the irradiation of the optical surfaces with said EUV-radiation or soft X-rays. Furthermore, any debris mitigation system between the radiation source and the first volume has to be operated in order to minimize further contamination of the optical surfaces due to the operation of the radiation source.

The cleaning step prior to the after treatment step is preferably performed in an operation pause of the irradiation unit, so that the first volume containing said optical surfaces to be cleaned can be separated from the second volume and from the radiation source in a preferably gastight manner. When this separation is done for the cleaning step, the separation or closing element between the first volume and the second volume remains during the after treatment step and only the separation or closing element between the first volume and the radiation source has to be removed prior to performing the after treatment step. Nevertheless it is also possible to perform the cleaning step during the normal operation of the irradiation unit, since most of the cleaning gases suitable for the cleaning step do not absorb EUV-radiation or soft X-rays significantly, so that these gases do not disturb the normal operation of the irradiation unit. In this case prior to the after treatment step or as a first measure of this step the first volume has to be separated from the second volume by appropriate separating elements.

The method according to claim 1 is based on the experience that with the cleaning step not all of the contaminations can be totally removed and residues from the cleaning step still remain on the optical surfaces. With the after treatment step of the present invention, however, at least a part of said residues can be released from the optical surfaces and pumped out of the first volume. This is achieved by said illumination of the optical surfaces with radiation from the radiation source which is operated continuously or pulsed to this end while the first volume is separated from the second volume containing highly sensitive optical components. After this after treatment step the separation of the two volumes is abandoned and the normal operation of the irradiation unit can start again.

Typical contaminations on the optical surfaces in EUV-radiation or soft X-ray irradiation units are inorganic materials, in particular materials such as tin, tellurium, indium, tungsten, molybdenum, lithium or antimony, which are released from the hot plasma. With the present method when selecting appropriate cleaning gases it is possible to remove the inorganic contaminations to a large extent. Typical cleaning gases for the cleaning step are hydrogen containing substances and/or halogens, inter-halogen compounds and/or halogen containing compounds. These cleaning gases can be the same as disclosed in the WO 2004/104707 A2 already mentioned. This document is included herein by reference with respect to a detailed description of the cleaning step of the present invention.

In a preferred embodiment of the method according to claim 1, during said after treatment step a second gas or gas mixture is brought into contact with said optical surfaces. Said second gas or gas mixture is selected to support the release of said residues from said optical surfaces and/or to convert said residues into compounds less absorbing the EUV-radiation or soft X-rays of the radiation source of the irradiation unit. To this end for example hydrogen, hydrogen containing compounds or hydrogen radicals like atomic hydrogen are delivered to said first volume. With this exemplary second gas halogen residues can be removed. When using oxygen as the second gas the transformation of EUV absorbing compounds as for example ruthenium iodide in less absorbing ruthenium oxide can be achieved. Oxygen as said second gas has the additional advantage of passivating the surfaces of the components in the first volume. Apart from oxygen also other gases, e. g. gases containing nitrogen, carbon or other elements, can be used, which cause such a transformation of the absorbing compounds in more stable and less absorbing compounds.

In the after treatment step according to claim 5, which can be performed in addition to or instead of the after treatment step of the characterizing part of claim 1 (i.e. with or without the separation of the first and second volume and the irradiation with EUV or X-rays), a third gas or gas mixture is brought into contact with said optical surfaces. Said third gas or gas mixture is selected to form a protective layer on said optical surfaces against the cleaning gas and/or against other gases used in the irradiation unit, e.g. against the fourth gas used in the pretreatment step, and/or to passivate said optical surfaces. Preferably, said third gas or gas mixture contains oxygen, hydrogen, nitrogen, carbon, silicon, sulphur or compounds, combinations or radicals of these elements. With such gases a thin protective layer, in particular a layer of metal oxide, metal nitride, metal hydroxide, metal oxynitride, metal carbide, metal silicide or metal sulfide, is formed on the optical surfaces which is chemically more resistant to the cleaning gas and other gases than the original optical surface. Therefore, the cleaning can be performed more intensely to achieve a better cleaning result. Furthermore, the lifetime of the optical components is increased with such a protective layer, which can be renewed after each cleaning step. As a matter of course, the protective layer is also selected to be highly transparent for EUV-radiation or soft X-rays.

The present method allows the repeated cleaning of the optical surfaces of optical components, for example of collector surfaces, to a high degree. This ensures a timely and spatially homogenous imaging, in particular a timely and spatially homogenous EUV-illumination of the mask and the wafer in an EUV irradiation unit. Moreover, with the present method a longer lifetime of the optical components in such a unit is achieved.

With the after treatment step of the present method a final cleaning of the optical components in the first volume is achieved. This after treatment step ensures that reaction products and residues of reaction gases do not remain in this volume. This applies for example to residues like metal halogenide compounds or solid residues on the optical surfaces. In order to perform the after treatment step it is only necessary to separate the first volume from the second volume, to operate the EUV radiation source once or several times and to pump out the released compounds. In a preferred embodiment the EUV radiation source is operated at a higher power level than during normal operation in order to speed up the release of residues on the optical surfaces.

In a further optional step following the after treatment step the optical components can be prepared for the following operation and new cleaning steps by a further treatment. The optical surfaces can be prepared for example by applying molecular hydrogen so that debris materials which contaminate the surfaces during the following normal operation of the irradiation unit are not oxidized on these surfaces. The hydrogen is incorporated into the surface material of the optical and other components in this preparation step and remains there in order to inhibit the oxidation of materials deposited later on. With this measure, the next cleaning step is supported since a smaller portion of the contaminations is oxidized resulting in a greater portion of the contaminations which can form a volatile or highly volatile compound with the cleaning gas.

In a further embodiment a pretreatment step is performed prior to the cleaning step. In this pretreatment step, which is performed in an operation pause of the irradiation unit, a fourth gas or gas mixture is brought into contact with said optical surfaces, wherein said fourth gas or gas mixture is selected to react with a portion of said contaminations, which portion cannot form volatile compounds with said cleaning gas or gas mixture, to form a reaction product, which is able to form a volatile compound with said cleaning gas or gas mixture. With this pretreatment step a portion of the contaminations, which normally does not form volatile or highly volatile compounds with the cleaning gas, is converted into compounds which later on in the cleaning step form such volatile or highly volatile compounds with the cleaning gas. With this measure it is possible to increase the portion of contaminations on the optical surfaces which can be removed during the cleaning step. As said fourth gas or gas mixture preferably gases or vapors having a reducing effect, such as atomic and/or molecular hydrogen and/or hydrogen compounds containing gases are used.

In the present description and claims the word "comprising" does not exclude other elements or steps and neither does "a" or "an" exclude a plurality. Also any reference signs in the claims shall not be construed as limiting the scope of these claims.

Figure 2:
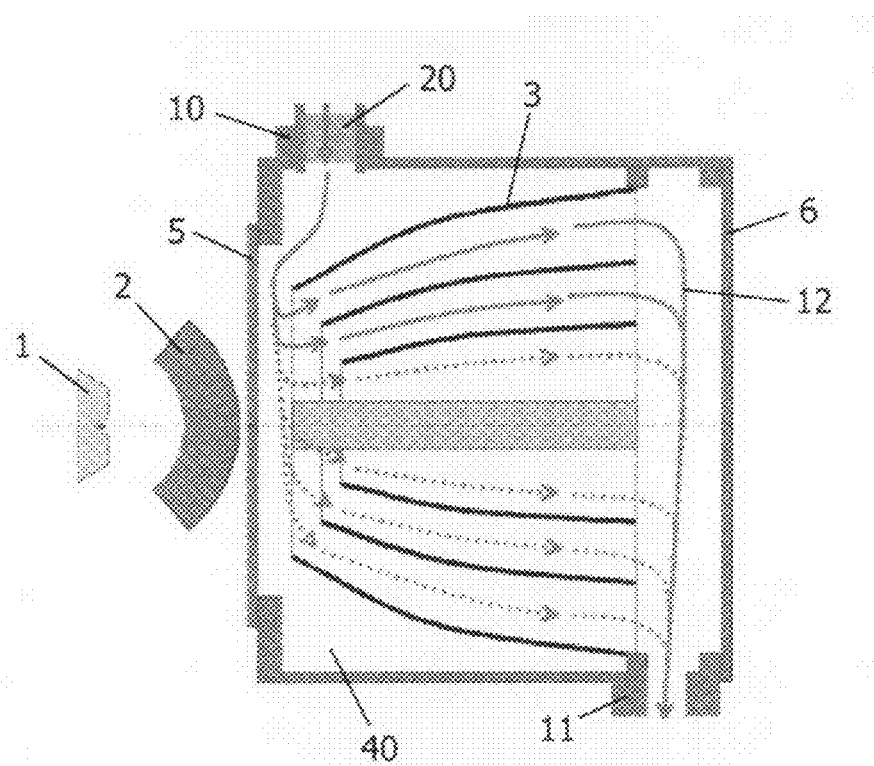
Figure 3:
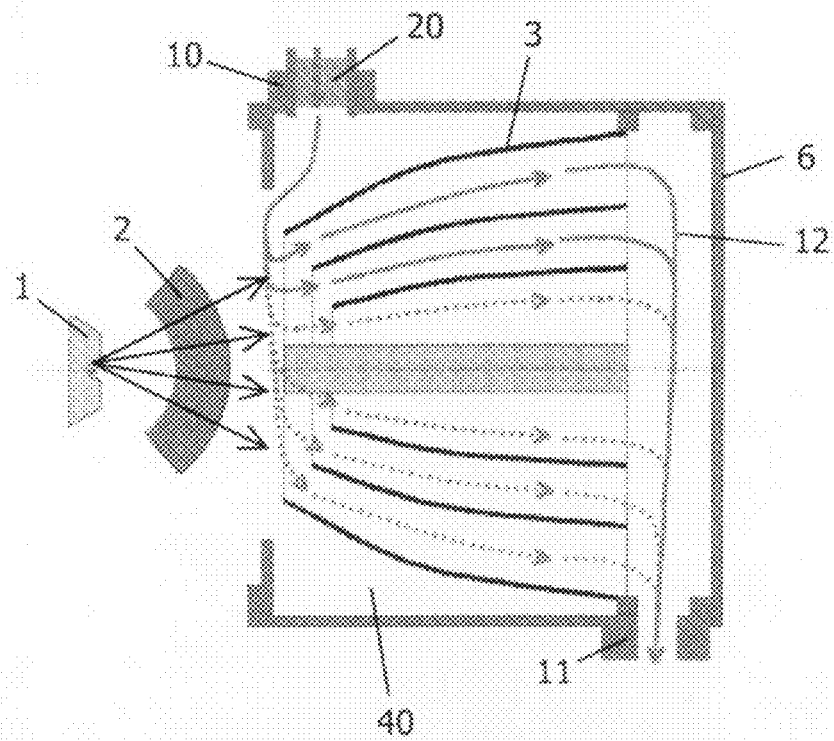
Figure 4:
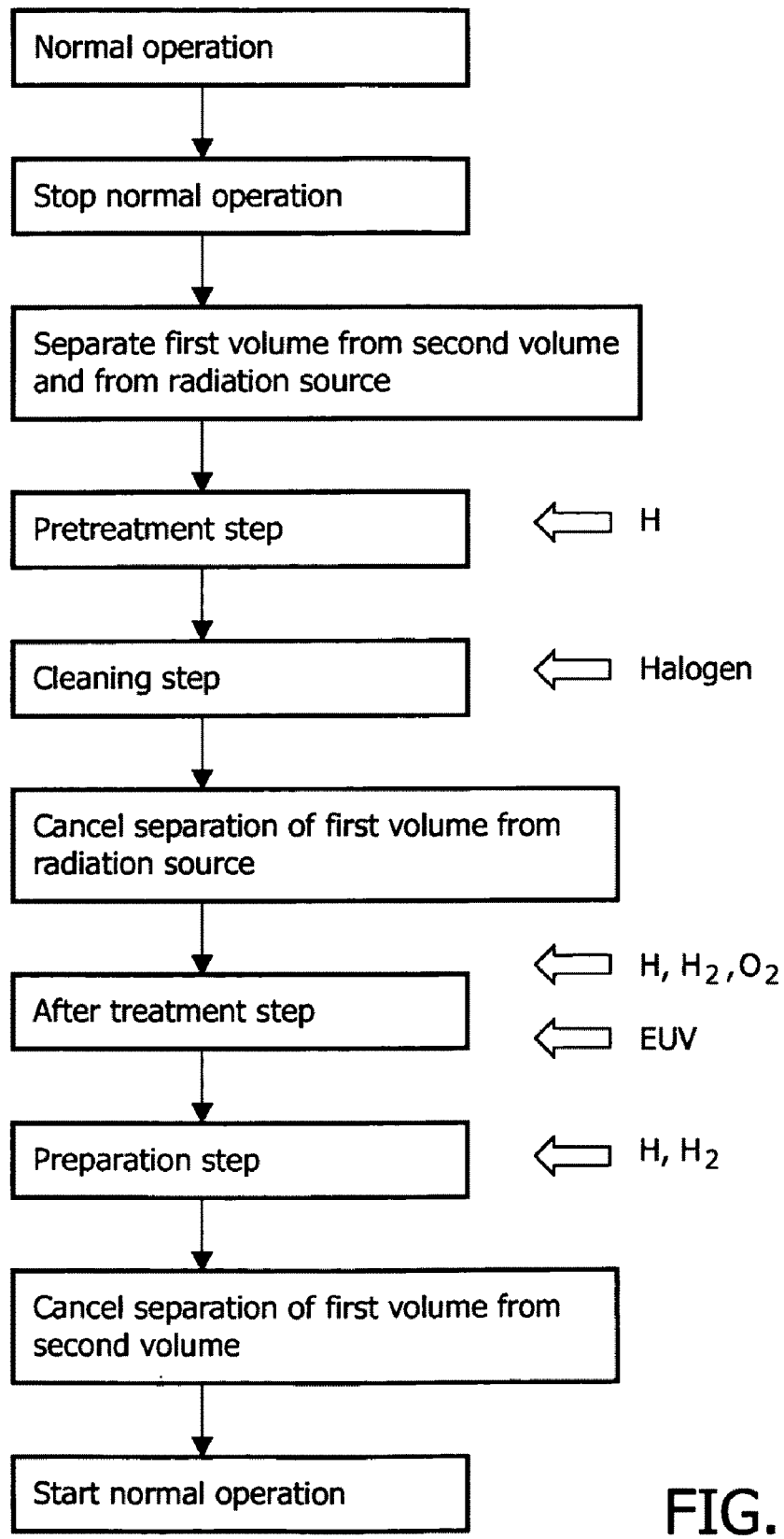

The following exemplary embodiments show examples of the present method with reference to the accompanying figures without limiting the scope of the invention. The figures show:

FIG. 1 a schematic configuration of an EUV irradiation unit;

FIG. 2 a schematic view of the first volume of the EUV irradiation unit separated from the radiation source and from the second volume;

FIG. 3 a schematic view of the first volume of the irradiation unit when performing the after treatment step; and FIG. 4 a flow chart showing one example of the present method.

A typical construction of a EUV irradiation unit has already been described in the introductory portion of the present description with respect to FIG. 1. Such an EUV irradiation unit can be subdivided into a first volume 40 containing the collector mirror 3, a second volume 41 following the first volume 40, said second volume 41 containing multilayer mirrors 38 for directing the generated EUV radiation via a mask (not shown) onto a wafer substrate 39. The EUV irradiation unit further comprises the radiation source 1 separated by a debris mitigation system 2 from the collector mirror 3. For cleaning purposes this radiation source 1 and debris mitigation system 2 in some cases can be moved away from the collector mirror 3. Otherwise it is arranged in a separate housing connected to the first volume 40 so that the debris mitigation system 2 and the radiation source 1 can be separated for cleaning purposes from the first volume 40 by a mechanical closing element 5 shown in FIG. 2. For the same purpose the first volume 40 can be separated from the second volume 41 by mechanical closing element 6, also shown in FIG. 2.

During normal operation of this EUV irradiation unit the passage from the radiation source 1 through the first volume 40 and the second volume 41 to the wafer substrate 39 is open, so that the optical radiation path 36 through the collector mirror 3, 33 and the multilayer mirrors 38 is not cut off. Normal operation of the EUV irradiation unit is performed until a specific amount of contamination of the collector mirror 3 by debris is detected. For the control of the mirror contamination optical sensors such as for example photodiodes or CCD cameras with EUV filters can be used. If the reflectivity measured by the sensors fall under a preset limit, the following cleaning step is started.

First the part of the irradiation unit that has to been cleaned, i.e. the first volume 40, is isolated from the radiation source 1 and from the second volume 41 by the mechanical closing elements 5 and 6 as shown in FIG. 2. The mechanical closing elements 5, 6 preferably completely separate the first volume 40 from the adjacent volumes. After this separation of the first volume, the cleaning step is performed by delivery of a cleaning gas, in the present example a halogen gas, through the inlet passage 10 of the first volume 40. In order to achieve an advantageous amount of radicals in the cleaning gas, a radical generation unit 20, for example hot filaments, is arranged in the inlet passage 10. Such radicals can speed up the cleaning process. The volatile compounds formed in this cleaning step are pumped out together with the remaining cleaning gas through outlet passage 11.

After this cleaning step, the closing element 5 separating the first volume 40 from the radiation source 1, is removed and the radiation source 1 as well as the debris mitigation system 2 are operated. This after treatment step is indicated in FIG. 3. Due to the illumination of the optical surfaces by the EUV radiation residues still remaining on these surfaces are released or desorbed and can be pumped out through the outlet passage 11. Additionally, gas supporting the release of the residues like atomic or molecular hydrogen or hydrogen containing compounds can be delivered to the first volume. The exemplary direction of gas flow 12 of the cleaning gas in the cleaning step and of the additional gas in the after treatment step is indicated in FIGS. 2 and 3.

The flow chart of FIG. 4 shows one example for a succession of steps in the present method. In this example also some of the optional or alternative process steps are indicated. One of these optional steps comprises an additional preparation of the optical surfaces after the after treatment step by delivering atomic or molecular hydrogen or hydrogen containing compounds to the first volume. The hydrogen is incorporated in this step in the surface material of the optical and other components and remains there in order to inhibit the oxidation of materials deposited later on.

As a further optional step a pretreatment step is indicated, which has already been described above. In this pretreatment step, which is also performed with the two closing elements 5, 6 separating the first volume 40 from adjacent volumes, atomic hydrogen is delivered to the first volume 40 and pumped out at the end of this step in order to prepare the subsequent cleaning step.

After all these steps the normal operation can be restarted. To this end the closing element 6 separating the first volume 40 from the second volume 41 is removed and the radiation source 1 as well as the debris mitigation system 2 are operated to perform the normal operation of the irradiation unit.

LIST OF REFERENCE SIGNS

1 EUV radiation source
2 debris mitigation system 3 collector mirror
5 mechanical closing element
6 mechanical closing element
10 gas inlet passage
11 gas outlet passage
12 direction of gas flow
20 unit for radical generation
31 radiation source
32 vacuum vessel
33 collector
34 tube to pump
35 intermediate focus
36 radiation path
37 means for debris mitigation
38 multilayer mirrors
39 wafer substrate
40 first volume
41 second volume

The invention claimed is:

1. A method of cleaning and after treatment of optical surfaces in an irradiation unit, the irradiation unit comprising a plasma radiation source emitting EUV-radiation and/or soft X-rays, a first volume following the plasma radiation source and containing first optical components with the optical surfaces, and a second volume following the first volume and containing second optical components, the method comprising
at least one cleaning step in which a first gas or gas mixture is brought into contact with the optical surfaces, thereby forming volatile compounds with contaminations released from a plasma radiation source deposited on the optical surfaces,
wherein:
the compounds are pumped out of the first volume together with the first gas or gas mixture,
in an after treatment step following the cleaning step the radiation source is operated once or several times in order to release residues of the cleaning step from the optical surfaces by irradiating the optical surfaces with the EUV-radiation or soft X-rays while the first volume is separated from the second volume, and the released residues are pumped out of the first volume.

2. The method of claim 1, wherein in the at least one cleaning step hydrogen containing gases and/or halogens and/or halogen compounds containing gases and/or corresponding radicals are used as the first gas or gas mixture.

3. The method of claim 1, wherein during the after treatment step a second gas or gas mixture is brought into contact with the optical surfaces, the second gas or gas mixture being selected to support the release of the residues from the optical surfaces and/or to convert the residues into compounds absorbing less radiation of the radiation source.

4. The method of claim 3, wherein atomic hydrogen, molecular hydrogen or a hydrogen containing compound is used as the second gas.

5. The method of claim 1, wherein in an after treatment step following the cleaning step a third gas or gas mixture is brought into contact with the optical surfaces, the third gas or gas mixture being selected to form a protective layer on the optical surfaces against the first gas or gas mixture and/or any other gas or gas mixture used in the irradiation unit and/or to passivate the optical surfaces.

6. The method of claim 5, wherein the third gas or gas mixture is selected to form an oxide, nitride, hydroxide oxynitride, carbide, silicide or sulfide layer.

7. The method of claim 3, wherein the second gas or gas mixture is selected to passivate the optical surfaces.

8. The method of claim 7, wherein oxygen is used as the second gas.

9. The method of claim 1, wherein in an operation pause of the irradiation unit prior to the at least one cleaning step a pretreatment step is performed, in which a fourth gas or gas mixture is brought into contact with the optical surfaces, wherein the fourth gas or gas mixture is selected to react with a portion of the contaminations, which portion cannot form volatile compounds with the first gas or gas mixture to form a reaction product, which product is able to form a volatile compound with the first gas or gas mixture.

10. The method of claim 9, wherein in the pretreatment step gases or vapors having a reducing effect are used as the fourth gas or gas mixture.

11. The method of claim 9, wherein atomic and/or molecular hydrogen and/or hydrogen compounds containing gases are used as the fourth gas or gas mixture.

12. The method of claim 1, wherein after the after treatment step a preparation step is performed by applying atomic or molecular hydrogen or hydrogen containing compounds to the optical surfaces.

* * * * *